(12) United States Patent
Han et al.

(10) Patent No.: US 12,289,955 B2
(45) Date of Patent: Apr. 29, 2025

(54) DISPLAY DEVICE AND METHOD FOR MANUFACTURING THE SAME

(71) Applicant: LG Display Co., Ltd., Seoul (KR)

(72) Inventors: Jongsoo Han, Paju-si (KR); Sangyong Lee, Goyang-si (KR); Sangmoo Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 672 days.

(21) Appl. No.: 17/459,619

(22) Filed: Aug. 27, 2021

(65) Prior Publication Data
US 2022/0069260 A1    Mar. 3, 2022

(30) Foreign Application Priority Data

Sep. 1, 2020    (KR) .................. 10-2020-0110968

(51) Int. Cl.
*H10K 50/86* (2023.01)
*H01L 27/12* (2006.01)
*H10K 59/12* (2023.01)
*H10K 59/122* (2023.01)
*H10K 59/123* (2023.01)
*H10K 59/126* (2023.01)
*H10K 59/131* (2023.01)
(Continued)

(52) U.S. Cl.
CPC ......... *H10K 50/865* (2023.02); *H01L 27/124* (2013.01); *H10K 59/122* (2023.02); *H10K 59/126* (2023.02); *H10K 59/131* (2023.02); *H10K 59/38* (2023.02); *H10K 59/805* (2023.02); *H10K 59/1201* (2023.02); *H10K 59/123* (2023.02)

(58) Field of Classification Search
CPC .. H10K 50/865; H10K 59/126; H01L 27/124; H01L 27/1214
See application file for complete search history.

(56) References Cited

U.S. PATENT DOCUMENTS 9,871,062 B2    1/2018   Im et al.
2014/0231764 A1*  8/2014   Park ..................... H10K 59/131
                                                          438/23
(Continued)

FOREIGN PATENT DOCUMENTS

KR   10-2016-0125598 A   11/2016
KR   10-2017-0126632 A   11/2017

*Primary Examiner* — Alia Sabur
(74) *Attorney, Agent, or Firm* — Birch, Stewart, Kolasch & Birch, LLP

(57) ABSTRACT

Discussed are a display device and a method for manufacturing the same, in which a source electrode and a drain electrode are disposed under an active layer of a thin film transistor, thereby simplifying a manufacturing process of the device, reducing a manufacturing time thereof, and reducing a manufacturing cost thereof. To this end, the source electrode, the drain electrode and a light-blocking layer are disposed on a substrate, and constitute the same layer and are made of the same material. An interlayer insulating layer is disposed thereon. A first contact-hole and a second contact-hole are disposed in the interlayer insulating layer. A first connection line connects the source electrode and an active layer to each other, and a second connection line connects the drain electrode and the active layer to each other, whereby the array substrate of the display device can be manufactured using the total of 7 mask processes.

11 Claims, 6 Drawing Sheets

(51) Int. Cl.
*H10K 59/38* (2023.01)
*H10K 59/80* (2023.01)

(56) References Cited

U.S. PATENT DOCUMENTS

2015/0380560 A1* 12/2015 Ishikawa ........... H01L 29/78696
257/43
2019/0131369 A1* 5/2019 Choi ................... H10K 59/131

* cited by examiner

DISPLAY DEVICE AND METHOD FOR MANUFACTURING THE SAME

CROSS-REFERENCE TO RELATED APPLICATION

This application claims a priority benefit under 35 U.S.C. § 119(a) to Korean Patent Application No. 10-2020-0110968 filed on Sep. 1, 2020, in the Korean Intellectual Property Office, the entire contents of which are incorporated herein by reference for all purposes into the present application.

BACKGROUND

Field

The present disclosure relates to a display device, and more specifically, to a display device and a method for manufacturing the same, in which a source electrode and a drain electrode are formed under an active layer of the thin film transistor, thereby simplifying a manufacturing process of the device, reducing a manufacturing time thereof, and reducing a manufacturing cost thereof.

Description of Related Art

An organic light emitting diode (OLED) based display device as one of flat panel display devices (FPDs) has high luminance and low operating voltage characteristics.

The OLED display device is self-luminous, and thus has a higher contrast ratio, can be implemented as an ultra-thin display device, and a response time thereof is a few microseconds, thereby making it easy to implement moving images. The OLED display device has no limitation in a viewing angle and is stable at low temperatures, and operates at a low voltage of 5 to 15V DC, thereby making it easy to manufacture and design a driver circuit.

In each pixel area of the OLED display device, a number of thin-film transistors such as a switching thin-film transistor, a driving thin-film transistor, and a sensing thin-film transistor are formed.

SUMMARY OF THE INVENTION

An array substrate for the OLED display device can be manufactured using a total of 9 mask processes including a first mask process for light-blocking layer formation, a second mask process for active layer formation, a third mask process for gate layer formation, a fourth mask process for contact-hole formation in an interlayer insulating layer, a fifth mask process for source electrode and the drain electrode formation, a sixth mask process for contact-hole formation in a protective layer, a seventh mask process for opening formation in a planarization layer, an eighth mask process for first electrode formation, and a ninth mask process for opening formation in a bank layer.

Further, the array substrate for the OLED display device can be manufactured using a total of 12 mask processes when forming a color filter layer including red, green, and blue color filters in addition to the above-described mask process.

Accordingly, due to excessive deposition and exposure, and etching processes, a manufacturing process of the array substrate for the OLED display device can be complicated, and a manufacturing time and a manufacturing cost thereof can be increased.

Thus, in order to address the above-described problems and other issues, the inventors of the present disclosure have formed a light-blocking layer and an active layer using a single mask process. Thus, we have invented a display device and a method for manufacturing the same in which a manufacturing process thereof is simplified, a manufacturing time thereof is reduced, and a manufacturing cost thereof is reduced.

Further, to achieve the above structure, the inventors of the present disclosure have formed a source electrode and a drain electrode under the active layer, and have formed a light-blocking layer constituting the same layer together with and made of the same material as the source electrode and the drain electrode and have selectively formed the blocking layer, the source electrode and the drain electrode under the driving thin film transistor. Thus, we have invented a display device and a method for manufacturing the same, in which a manufacturing process thereof is simple, a manufacturing time, and a manufacturing cost thereof are reduced, and malfunction of the thin-film transistor is prevented.

Purposes according to the present disclosure are not limited to the above-mentioned purpose. Other purposes and advantages according to the present disclosure that are not mentioned can be understood based on following descriptions, and can be more clearly understood based on embodiments according to the present disclosure. Further, it will be easily understood that the purposes and advantages according to the present disclosure can be realized using means shown in the claims and combinations thereof.

A display device according to an embodiment of the present disclosure can be provided. In the display device, a source electrode and a drain electrode spaced apart from each other are disposed on a substrate, and a light-blocking layer constituting the same layer together with and made of the same material as the source electrode and the drain electrode is disposed on the substrate. An interlayer insulating layer is disposed on the source electrode, the drain electrode and the light-blocking layer. A first contact-hole and a second contact-hole corresponding to the source electrode and the drain electrode are formed in the interlayer insulating layer. A first connection line connects the source electrode and an active layer to each other via the first contact-hole, while a second connection line connects the drain electrode and the active layer to each other via the second contact-hole.

Further, a method for manufacturing a display device according to an embodiment of the present disclosure can be provided. In the method for manufacturing the display device, a source electrode and a drain electrode spaced from each other, and a light-blocking layer made of the same material as and constituting the same layer together with the source electrode and the drain electrode are formed on a substrate using a first mask process M1. An interlayer insulating layer is formed on the source electrode, the drain electrode and the light-blocking layer using a second mask process M2, wherein a first contact-hole and a second contact-hole respectively corresponding to the source electrode and the drain electrode are formed in the interlayer insulating layer. An active layer is formed on the interlayer insulating layer using a third mask process M3. An gate insulating layer and a gate electrode are sequentially formed on the active layer using a fourth mask process M4, wherein a first connection line connecting the source electrode and the active layer with each other via the first contact-hole, and a second connection line connecting the drain electrode and the active layer with each other via the second contact-hole are formed. A protective layer and a planarization layer are sequentially formed on the gate electrode using a fifth mask process M5, wherein a third contact-hole is formed in the planarization layer and the protective layer to correspond to the first connection line. A first electrode is formed on the planarization layer using a sixth mask process M6, wherein the first electrode is connected to the first connection line via the third contact-hole in the protective layer and planarization layer. Then, a light-emissive layer is formed on the first electrode, and a second electrode is formed on the light-emissive layer using a seventh mask process M7.

Therefore, in the display device and the method for manufacturing the display device according to an embodiment of the present disclosure, the array substrate of the display device can be manufactured using the total 7 mask processes. A color filter layer including red, green, and blue color filters corresponding to each pixel area can be formed between the protective layer and the planarization layer using additional 3 mask processes. Thus, as the display device can be manufactured with a total of 10 mask processes, the number of the steps of the manufacturing process can be reduced, compared to that in the conventional method.

According to an embodiment of the present disclosure, forming the source electrode, the drain electrode, and the light-blocking layer using a single mask process can allow the manufacturing process of the device to be simplified, the manufacturing time thereof to be reduced, and the manufacturing cost thereof to be reduced.

Further, according to the present disclosure, the light-blocking layer extends from the source electrode and is selectively formed only under the active layer of the driving thin-film transistor Tdr, thereby preventing malfunction of a switching thin-film transistor Tsw and a sensing thin-film transistor Tse.

Further, according to an embodiment of the present disclosure, forming the third contact-hole in the protective layer and the planarization layer using a single mask process can allow the manufacturing process of the device to be simplified, the manufacturing time thereof to be reduced, and the manufacturing cost thereof to be reduced.

Further, according to the present disclosure, the color filter layer including red, green, and blue color filters corresponding to each pixel area P can be formed between the protective layer and the planarization layer using three additional mask processes, thereby improving color reproducibility.

Moreover, in the display device and the method for manufacturing the display device according to the present disclosure, depositions of the light-blocking material layer and the buffer material layer are omitted. Thus, as the number of the deposition processes is reduced, the manufacturing cost is reduced.

Effects of the present disclosure are not limited to the above-mentioned effects, and other effects as not mentioned will be clearly understood by those skilled in the art from following descriptions.

BRIEF DESCRIPTION OF DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
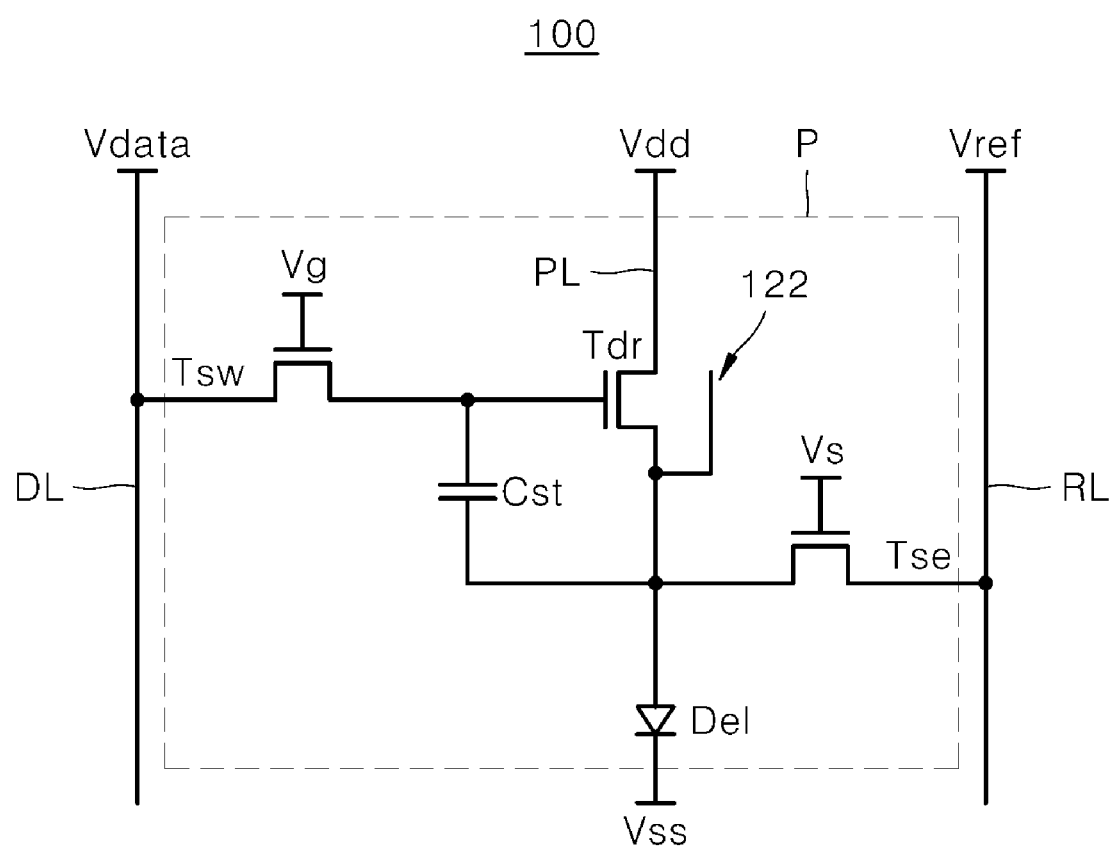
FIG. 1 shows an equivalent circuit diagram of a pixel area of an array substrate in a display device according to the embodiment of the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but can be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and can not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is not indicated.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section, and may not define order. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to one or more embodiments of the present disclosure and a method for manufacturing the same will be described. In this connection, a case in which the display device is embodied as an organic light-emitting diode (OLED) display device will be described by way of example. However, the present disclosure is not limited thereto. Further, all the components of each OLED display device and other display devices according to all embodiments of the present disclosure are operatively coupled and configured.

Figure 2:
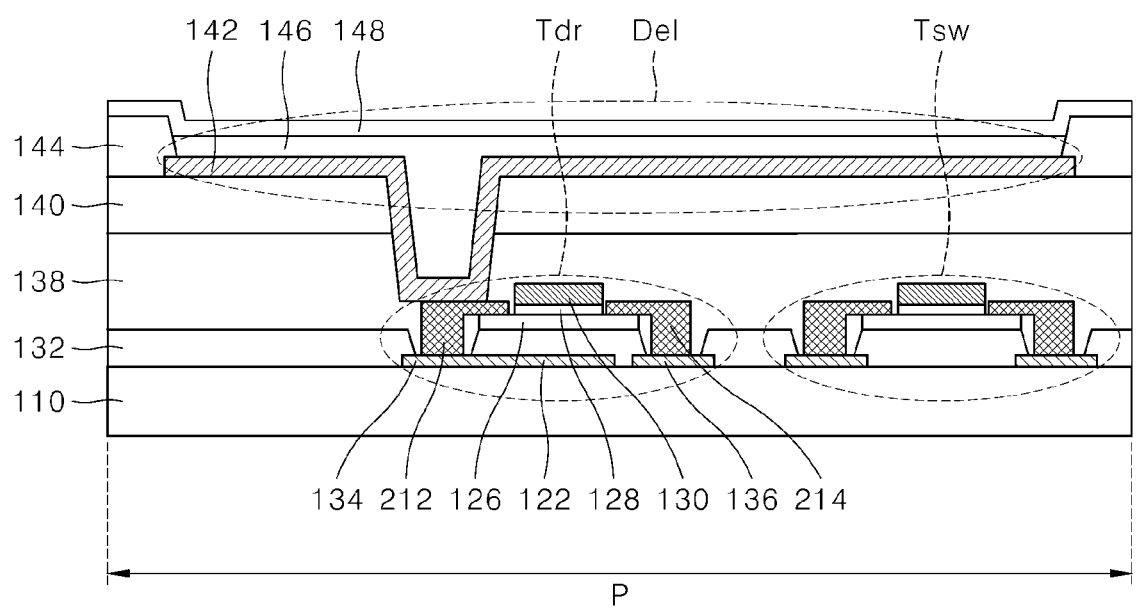
FIG. 2 is a cross-sectional view showing a cross section of an array substrate of a display device according to an embodiment of the present disclosure.

FIG. 1 shows an equivalent circuit diagram of a pixel area of an array substrate in a display device according to the embodiment of the present disclosure. FIG. 2 is a cross-sectional view showing a cross section of an array substrate of a display device according to an embodiment of the present disclosure.

As shown in FIG. 1 and FIG. 2, on an array substrate of a display device 100 according to an embodiment of the present disclosure, a gate line, a sensing line, a data line DL, a power line PL, and a reference line RL are formed and cross each other to define a pixel area P.

Moreover, in each pixel area P, a switching thin-film transistor Tsw, a driving thin-film transistor Tdr, a sensing thin-film transistor Tse, a storage capacitor Cst, and a light-emitting diode Del are formed.

Each of the switching thin-film transistor Tsw, the driving thin-film transistor Tdr and the sensing thin-film transistor Tse includes an active layer 126, a gate electrode 130, a source electrode 134 and a drain electrode 136. The light-emitting diode Del includes a first electrode 142, a light-emissive layer 146 and a second electrode 148.

The gate electrode, the source electrode and the drain electrode of the switching thin-film transistor Tsw are connected to the gate line, the data line DL and the gate electrode of the driving thin-film transistor Tdr, respectively. The gate electrode, the source electrode and the drain electrode of the driving thin-film transistor Tdr are connected to the drain electrode of the switching thin-film transistor Tsw, the positive electrode of the light-emitting diode Del, and the power line PL, respectively.

The gate electrode, the source electrode and the drain electrode of the sensing thin-film transistor Tse are connected to the sensing line, the source electrode of the driving thin-film transistor Tdr, and the reference line RL, respectively. The storage capacitor Cst is connected to and disposed between the gate electrode and the source electrode of the driving thin-film transistor Tdr.

The positive and negative electrodes of the light-emitting diode Del are connected to the source electrode of the driving thin-film transistor Tdr and a low potential voltage Vss, respectively.

Moreover, the light-blocking layer 122 is formed under the active layer 126 of the driving thin-film transistor Tdr. The light-blocking layer 122 prevents light from being incident on the active layer 126 of the driving thin-film transistor Tdr to prevent a leakage current from being generated. For electrical stability, the light-blocking layer 122 is connected to the source electrode 134 of the driving thin-film transistor Tdr.

For example, the light-blocking layer 122 can extend from the source electrode 134 and can constitute the same layer together with can be made of the same material as the source electrode 134 and the drain electrode 136.

Specifically, in the display device 100 according to the embodiment of the present disclosure, the source electrode 134 and the drain electrode 136 can be spaced apart from each other and can be disposed on a top face of the substrate 110. The light-blocking layer 122 extending from the source electrode 134 can be disposed on a top face of the substrate 110 and can constitute the same layer together with can be made of the same material as the source electrode 134 and the drain electrode 136.

Further, an interlayer insulating layer 132 is disposed over an entire face of the substrate 110 while being disposed on a top face of the source electrode 134, the drain electrode 136 and the light-blocking layer 122. The interlayer insulating layer 132 has a first contact-hole CNT1 and a second contact-hole CNT2 defined therein for exposing the source electrode 134 and the drain electrode 136, respectively.

Further, the active layer 126 is disposed on a top face of the interlayer insulating layer 132 so that a portion of the interlayer insulating layer is exposed. A gate insulating layer 128 is disposed on a top face of the active layer 126 so that a portion of the interlayer insulating layer and a portion of the active layer are exposed.

The first contact-hole CNT1 and the second contact-hole CNT2 can extend via the interlayer insulating layer 132, the active layer 126, and the gate insulating layer 128 and correspond to the source electrode 134 and the drain electrode 136, respectively.

Further, a gate electrode 130 is disposed on a top face of the gate insulating layer 128. A first connection line 212 connecting the source electrode 134 and the active layer 126 to each other can fill the first contact-hole CNT1. A second connection line 214 connecting the drain electrode 136 and the active layer 126 to each other can fill the second contact-hole CNT2.

For example, one of both exposed opposing ends of the active layer 226 as disposed on a top face of the interlayer insulating layer 132 is connected to the source electrode 234 via the first connection line 212 connected to a first contact-hole of the interlayer insulating layer 132, while the other is connected to the drain electrode 136 via the second connection line 214 connected to the second contact-hole of the interlayer insulating layer 132.

In this connection, the gate electrode 130, the first connection line 212 and the second connection line 214 can constitute the same layer and can be made of the same material. Preferably, the first connection line 212 and the second connection line 214 can be made of a copper (Cu) based material having a low resistance, for example, 10Ω and being conductive.

Further, the gate electrode 130, the first connection line 212 and the second connection line 214 can be formed in the same layer using the same mask process. In this connection, the first connection line 212 is formed to connect the source electrode 134 and the active layer 126 to each other via the first contact-hole CNT1, while the second connection line 214 is formed to connect the drain electrode 136 and the active layer 126 to each other via the second contact-hole CNT2. Thus, it is not necessary to extend an existing active layer 126 in an elongate manner to form a line connecting the active layer to each of the source electrode 134 and the drain electrode 136. In other words, when the active layer 126 is used as a line, a metallization process of the active layer 126 is required. However, as the active layer 126 is extended to act as the line, a metallization target area increases. Thus, poor metallization can occur. Further, the metallized state can return to a non-metallized state due to heat treatment and other events. However, according to the present disclosure, forming the first connection line 212 and the second connection line 214 together with the forming of the gate electrode 130 can allow a stable conductive state of each connection line. Therefore, for the formation of the first connection line 212 and the second connection line 214 according to the present disclosure, the active layer 126 is not used. Further, the metallization of the active layer 126 is not required. The metallization process of the active layer 126 is absent.

Otherwise, when the active layer 126 acts as the line, resistance of the active layer 126 is high and is about 5,000Ω or lower. However, resistance of each of the first connection line 212 and the second connection line 214 according to the present disclosure is merely 10Ω.

In this connection, one side of the first connection line 212 contacts one end of the active layer 126 exposed through the gate insulating layer 128, while the opposite side of the first connection line 212 contacts the source electrode 134. One side of the second connection line 214 contacts the opposite end of the active layer 126 exposed through the gate insulating layer 128, while the opposite side of the second connection line 214 contacts the drain electrode 136.

Further, the first connection line 212 and the second connection line 214 are made of the same material as the gate electrode 130 disposed on a top face of the gate insulating layer 128. However, one side of each of the first connection line 212 and the second connection line 214 in contact with the active layer 126 is spaced from the gate electrode 130 by a certain spacing.

Further, on a top face of the active layer 226, the gate insulating layer 128 and the gate electrode 130 having the same shape are formed. In another embodiment, the gate insulating layer 128 can be formed over an entire face of the substrate 120.

Further, a protective layer 138 and a planarization layer 140 are sequentially disposed on a top face of the gate electrode 130. The protective layer 138 is disposed to cover the interlayer insulating layer, the first connection line, the gate electrode and the second connection line. The planarization layer 140 is disposed on a top face of the protective layer.

Further, a third contact-hole is formed in the protective layer 138 and the planarization layer 140 and at a position overlapping the source electrode 134.

Further, the first electrode 142 is disposed on a top face of the planarization layer 140 and is connected to the first connection line 212 via the third contact-hole. The light-emissive layer 146 is disposed on a top face of the first electrode 142. The second electrode 148 is disposed on a top face of the light-emissive layer 146. For example, the first electrode 142 is connected to the first connection line 212 and one end of the active layer 126 via the third contact-hole in the protective layer 138 and the planarization layer 140. Thus, the first electrode 142 is connected to the source electrode 134 via the first connection line 212.

The light-emissive layer 146 includes a hole injecting layer HIL, a hole transporting layer HTL, a light emitting material layer EML, an electron transporting layer ETL, and an electron injecting layer EIL.

A color filter layer including red, green, and blue color filters corresponding to each pixel area P can be formed between the protective layer 138 and the planarization layer 140. In this case, color reproducibility is improved.

Further, on a top face of the planarization layer 140, a bank layer 144 is disposed to cover an outer region of the first electrode 142 and expose an inner region of the first electrode. Thus, the second electrode 148 is disposed on a top face of the light-emissive layer 146 and a portion of a top face of the bank layer 144.

In FIG. 2, the source electrode 134, the drain electrode 136, the active layer 126, the first connection line 212, the second connection line 214 and the gate electrode 130 constitute the driving thin-film transistor Tdr.

In one example, the switching thin-film transistor Tsw and the sensing thin-film transistor Tse connected to the driving thin-film transistor Tdr are disposed in each pixel area P. Each of the switching thin-film transistor Tsw and the sensing thin-film transistor Tse can have the same structure as that of the driving thin-film transistor Tdr except for the light-blocking layer 122.

Further, on a top face of the substrate 110, the switching thin-film transistor Tsw connected to the driving thin-film transistor Tdr can be disposed. As in the driving thin-film transistor, the switching thin-film transistor Tsw can have a structure in which a second source electrode and a second drain electrode are formed on a top face of the substrate, the second source electrode and the second drain electrode are connected to a second active layer via a third connection line and a fourth connection line extending through a fourth contact-hole and a fifth contact-hole, respectively.

As described above, in the array substrate of the display device 100 according to the embodiment of the present disclosure, the source electrode 134, the drain electrode 136 and the light-blocking layer 122 can be formed using a single mask process, and the contact-holes can be formed in the protective layer 138 and the planarization layer 140 vis a single mask process. Thus, the array substrate can be manufactured using a total of 7 mask processes, resulting in a simplified manufacturing process, a reduced manufacturing time, and a reduced manufacturing cost.

Further, the source electrode 134 and the drain electrode 136 are formed under the active layer 126. The source electrode 134, the drain electrode 136 and the light-blocking layer 122 constituting the same layer and made of the same material are selectively formed as a lower portion of the thin-film transistor Tdr. Thus, the manufacturing process is simplified, the manufacturing time is reduced, the manufacturing cost is reduced, and the malfunction of the switching thin-film transistor Tsw and the sensing thin-film transistor Tse is prevented.

Moreover, since the depositions of the light-blocking material layer and the buffer material layer are omitted, the number of deposition processes is reduced such that the manufacturing cost is reduced.

The array substrate of the OLED display device 100 can be manufactured by a total of 7 mask processes. This will be described with reference to the drawings.

Figure 3:
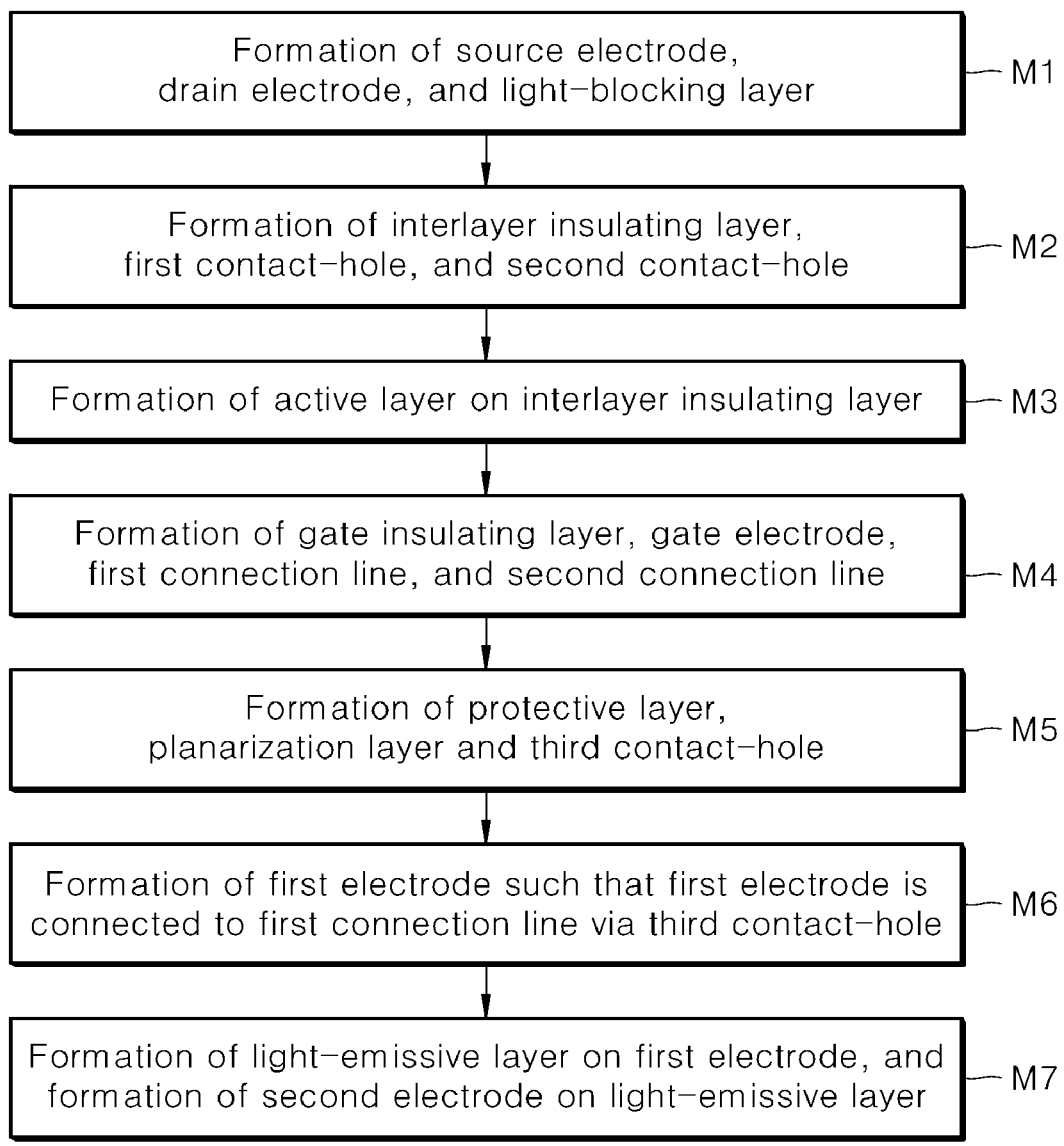
FIG. 3 is a flowchart sequentially showing a process of manufacturing an array substrate in a method for manufacturing a display device according to the present disclosure.

FIG. 3 is a flowchart sequentially showing a process of manufacturing an array substrate in a method for manufacturing a display device according to the present disclosure. FIGS. 4 to 10 are cross-sectional views sequentially showing a process for manufacturing an array substrate of a display device according to an embodiment of the present disclosure.

With reference to FIGS. 3 to 10, a manufacturing process of an array substrate of a display device according to an embodiment of the present disclosure will be described.

Figure 4:
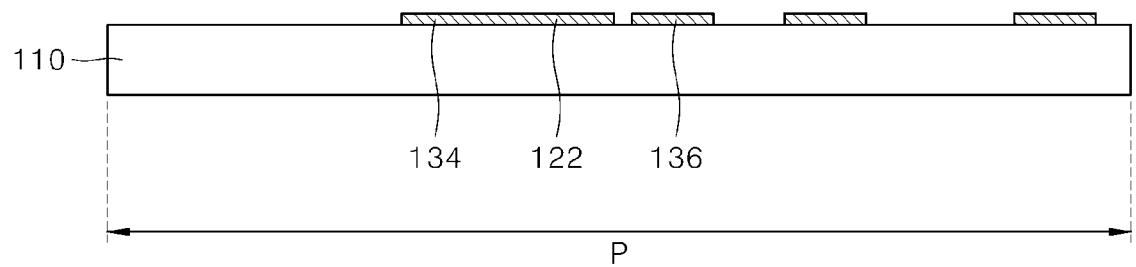
FIGS. 4 to 10 are cross-sectional views sequentially showing a process for manufacturing an array substrate of a display device according to an embodiment of the present disclosure.

As shown in FIG. 3 and FIG. 4, a source and drain electrode material layer is formed on a top face of the substrate 110, and the source electrode 134, the drain electrode 136 and the light-blocking layer 122 is formed using a first mask process M1.

In more detail, a source and drain electrode material layer and a light-blocking metal layer are formed on the substrate 110, and a photoresist PR is formed on the source and drain electrode material layer and the light-blocking metal layer. Thereafter, a photoresist pattern is formed by an exposure and development process using a mask including a transmissive region and a blocking region. The source electrode 134, the drain electrode 136, and the light-blocking layer 122 are formed by etching the source drain electrode material layer and the light-blocking metal layer using the photoresist pattern as a mask.

The source and drain electrode material layer can be made of one of molybdenum (Mo), titanium (Ti), tantalum (Ta), tungsten (W), copper (Cu), chromium (Cr), aluminum (Al), and combinations thereof. Further, a transparent conductive material such as ITO (Indium Tin Oxide) can be used for the source and drain electrode material layer. However, the present invention is not limited thereto. The source and drain electrode material layer can be made of a material that can be generally used for an electrode.

The substrate 110 can be embodied as an insulating substrate made of a glass or plastic. Further, the source electrode 134, the drain electrode 136, and the light-blocking layer 122 can be made of an opaque metal material. For example, the source electrode 134, the drain electrode 136, and the light-blocking layer 122 can be made of at least one selected from a group of conductive metals including aluminum (Al), tungsten (W), copper (Cu), molybdenum (Mo), chromium (Cr), titanium (Ti), molybdenum-tungsten (MoW), molybdenum-titanium (MoTi), and copper/molybdenum-titanium (Cu/MoTi). However, the material for the light-blocking layer 122 is not limited thereto. As long as a material is capable of blocking light, the material can be used for the light-blocking layer 122.

In this way, forming the source electrode 134, the drain electrode 136, and the light-blocking layer 122 using the single mask process can allow the manufacturing process to be simplified, the manufacturing time to be reduced, and the manufacturing cost to be reduced.

Moreover, the light-blocking layer 122 can extend from the source electrode 134 and can be selectively formed only under the active layer 126 of the driving thin-film transistor Tdr. Accordingly, the malfunction of the switching thin-film transistor Tsw and the sensing thin-film transistor Tse can be prevented.

Figure 5:
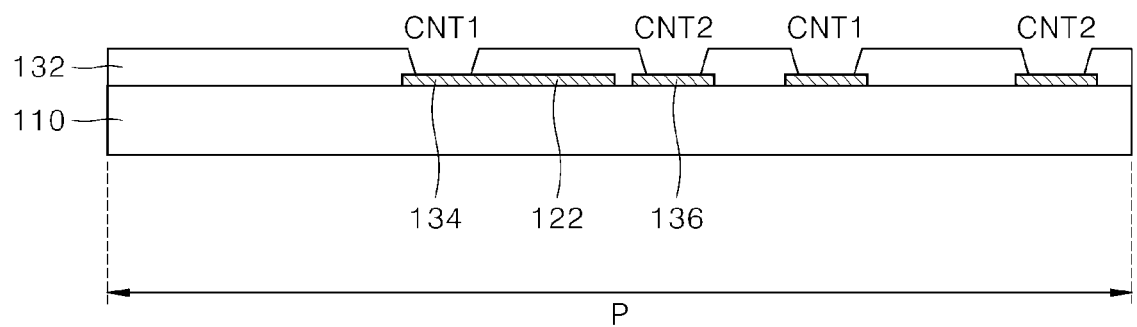

Then, as shown in FIGS. 3 and 5, the interlayer insulating layer 132 is formed on a top face of the source electrode 134, the drain electrode 136 and the light-blocking layer 122. The first contact-hole CNT1 and the second contact-hole CNT2 are formed in the interlayer insulating layer 132 to respectively correspond to the source electrode 134 and the drain electrode 136 using a second mask process M2.

Figure 6:
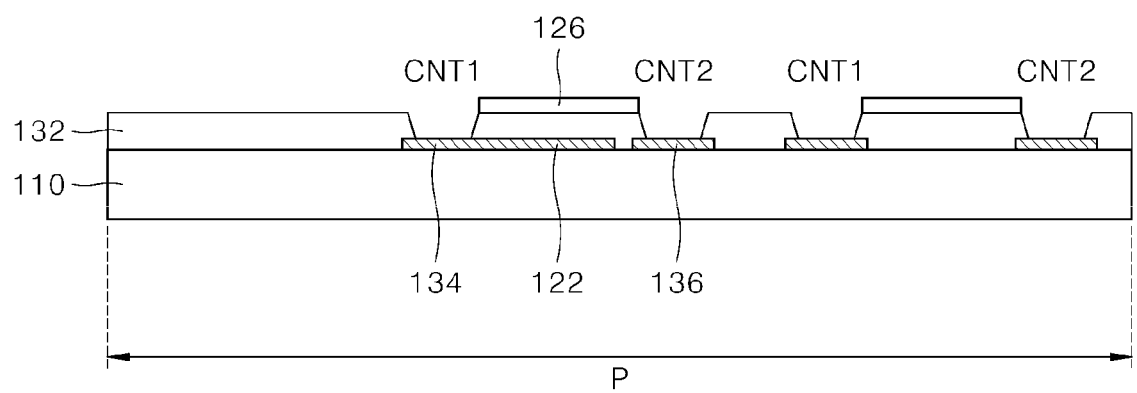

Next, as shown in FIG. 3 and FIG. 6, an active material layer is formed on a top face of the interlayer insulating layer 132 and in locations corresponding to the source electrode 134 and the drain electrode 136, respectively. Then, a third mask process M3 is performed to form the active layer 126. In this connection, the active layer 126 is formed on a top face of the interlayer insulating layer 132 so that a portion of the interlayer insulating layer 132, the first contact-hole CNT1 and the second contact-hole CNT2 are exposed.

Figure 7:
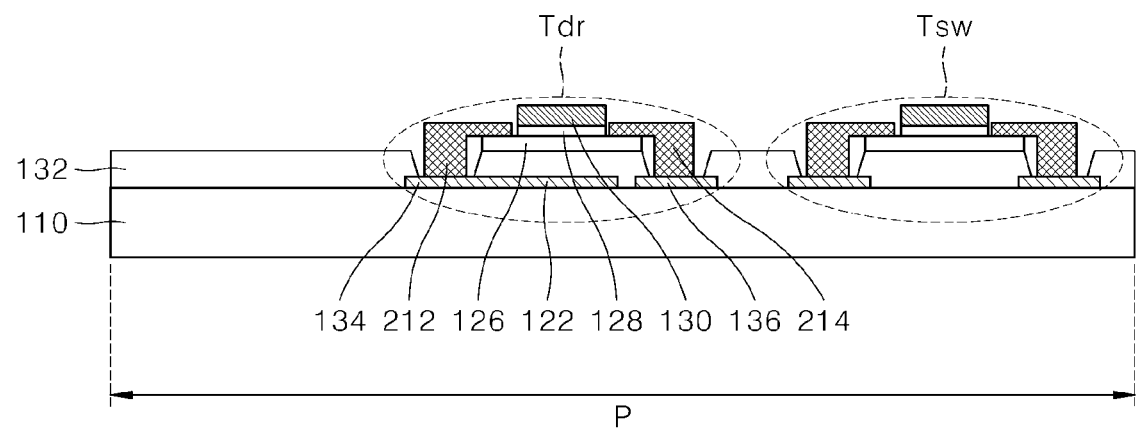

Then, as shown in FIG. 3 and FIG. 7, a gate insulating material layer and a gate material layer are sequentially formed on a top face of the active layer 126. The gate insulating layer 128 and the gate electrode 130 are formed using a fourth mask process M4.

For example, the gate insulating layer 128 is formed on a top face of the active layer 126 so that a portion of the interlayer insulating layer 132, a portion of the active layer 126, the first contact-hole CNT1 and the second contact-hole CNT2 are exposed. The gate electrode 130 is formed on a top face of the gate insulating layer 128. The first connection line 212 is formed to connect the source electrode 134 and the active layer 126 to each other via the first contact-hole CNT1. The second connection line 214 is formed to connect the drain electrode 136 and the active layer 126 to each other via the second contact-hole CNT2.

In this connection, the gate electrode 130, the first connection line 212 and the second connection line 214 are made of the same material and are formed in the same layer using the same mask process. The same material can be a conductor material with low resistance, for example, Cu.

Further, the first connection line 212 and the second connection line 214 connect the active layer 126 to the source electrode 134 and the drain electrode 136, respectively. Thus, the active layer 126 does not need to act a line. The metallization of the active layer 126 is not required. The metallization process of the active layer 126 is not conducted.

Further, each of the first connection line 212 and the second connection line 214 is in contact with the active layer 126, but is spaced apart from the gate electrode 130 by a predefined spacing.

In this connection, as for the switching thin-film transistor Tsw, a further connection line 212 connects a further source electrode 134 and a further active layer 126 to each other via a further first contact-hole CNT1. A further second connection line 214 connects a further drain electrode 136 and the further active layer 126 to each other via a further second contact-hole CNT2.

The gate insulating layer 128 can be made of a dielectric or a high-k dielectric such as $SiO_x$, $SiN_x$, SiON, $HfO_2$, $Al_2O_3$, $Y_2O_3$, $Ta_2O_5$, or a combination thereof. However, the present disclosure is not limited thereto. The gate insulating layer 128 can be composed of a single layer as in the drawing, or can be composed of two or more layers.

In another embodiment, only the gate electrode material layer can be etched while not etching the gate insulating material layer. In this case, the gate insulating layer 128 can be formed over an entire face of the substrate 110.

The gate electrode 130 can be formed by a mask process using photoresist PR. Further, the gate electrode 130 can be made of at least one selected from a non-transparent metal group including aluminum (Al), tungsten (W), copper (Cu), molybdenum (Mo), chromium (Cr), tantalum (Ta), titanium (Ti), and alloys made of combinations thereof. The present disclosure is not limited thereto.

Figure 8:
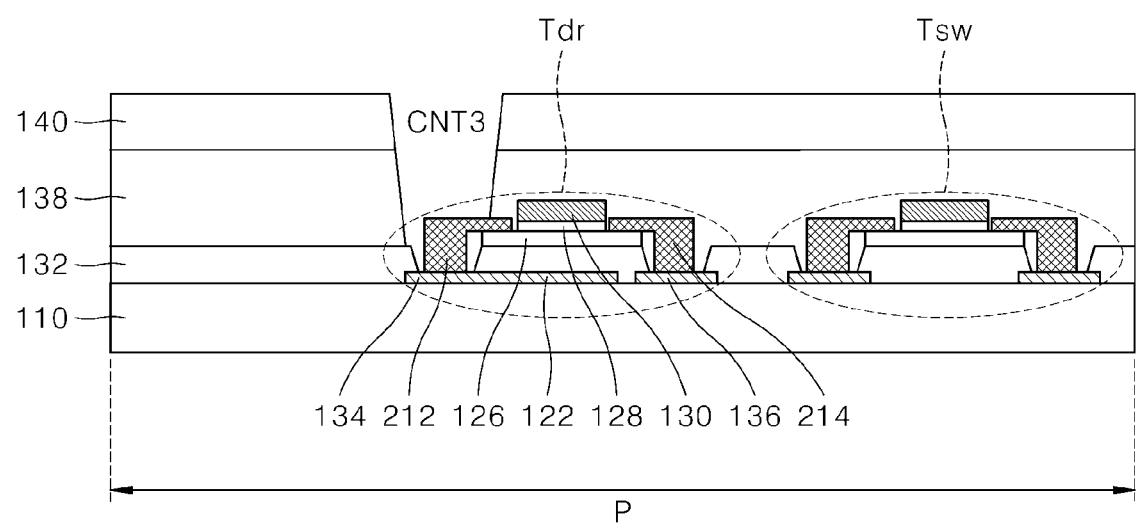

Then, as shown in FIG. 3 and FIG. 8, the protective layer 138 and the planarization layer 140 are sequentially formed on a top face of the gate electrode 130. The third contact-hole CNT3 is formed in the planarization layer 140 and the protective layer 138 to expose the first connection line 212 using a fifth mask process M5.

In this way, forming the third contact-hole CNT3 in the protective layer 138 and the planarization layer 140 using the single mask process can allow the manufacturing process to be simplified, the manufacturing time to be reduced, and the manufacturing cost to be reduced.

In one example, a color filter layer including red, green, and blue color filters corresponding to each pixel area P can be formed between the protective layer 138 and the planarization layer 140 using three additional mask processes. In this case, color reproducibility can be improved.

Figure 9:
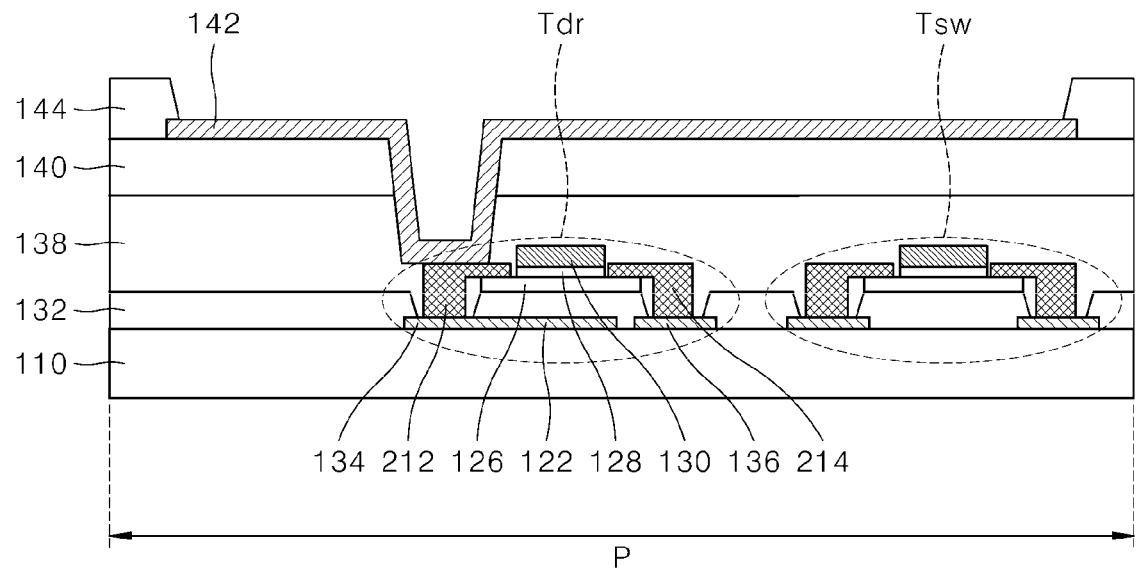

Then, as shown in FIG. 3 and FIG. 9, an electrode material is formed on a top face of the planarization layer 140, and the first electrode 142 is formed by a sixth mask process M6. The first electrode 142 is formed to be connected to the first connection line 212 via the third contact-hole CNT3 formed in the protective layer 138 and the planarization layer 140. Thus, the first electrode 142 is connected to the source electrode 134 via the first connection line 212 connected to the third contact-hole CNT3.

Figure 10:
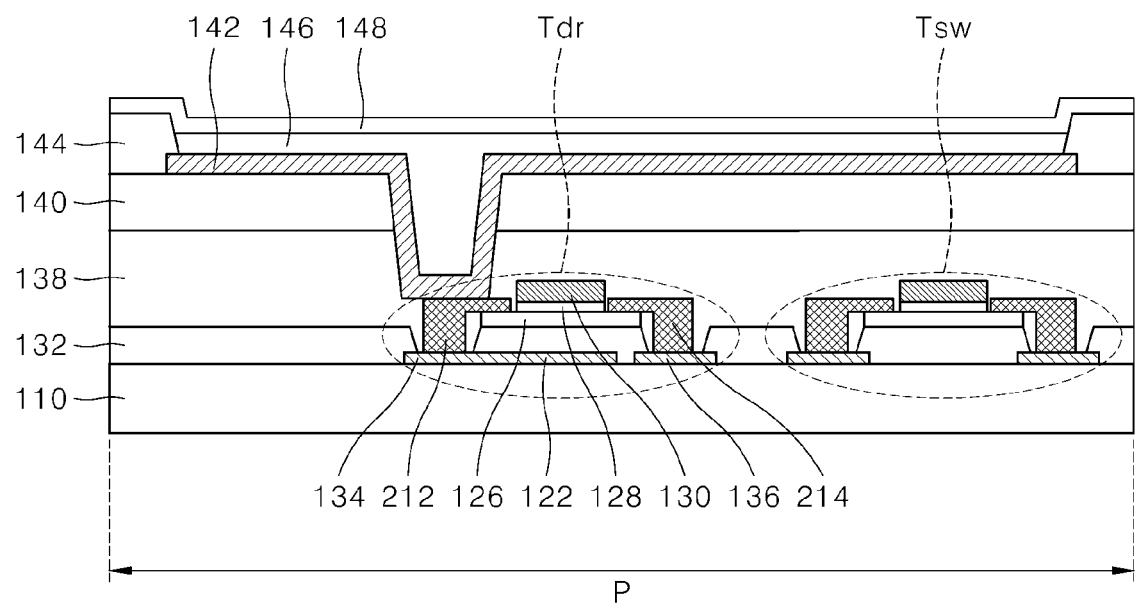

Then, as shown in FIG. 3 and FIG. 10, the bank layer 144 is formed on a top face of the first electrode 142. Using a seventh mask process M7, an opening is formed in the bank layer 144 such that the outer region of the first electrode 142 is covered with the bank layer and the inner region of the first electrode 142 is exposed through the bank layer. The light-emissive layer 146 is formed on a top face of the first electrode 142 exposed through the opening of the bank layer 144, and the second electrode 148 is formed on a top face of the light-emissive layer 146 and over an entire face of the substrate 110.

The light-emissive layer 146 can be formed by a thermal evaporation process using a shadow mask, or by a solution process using an inkjet.

As described above, in the manufacturing method of the array substrate of the display device 100 according to the embodiment of the present disclosure, forming the source electrode 134, the drain electrode 136 and the light-blocking layer 122 using the single mask process, and forming the contact-hole in the protective layer 138 and the planarization layer 140 using the single mask process can allow the array substrate to be manufactured using a total of 7 mask processes. As a result, the manufacturing process is simplified, the manufacturing time is reduced, and the manufacturing cost is reduced.

Further, the source electrode 134 and the drain electrode 136 are formed under the active layer 126. The source electrode 134 and the drain electrode 136 and the light-blocking layer 122 constituting the same layer and made of the same material are selectively formed only under the thin-film transistor Tdr. Thus, the manufacturing process is simplified, the manufacturing time is reduced, the manufacturing cost is reduced, and the malfunction of the switching thin-film transistor Tsw and the sensing thin-film transistor Tse is prevented.

Moreover, since the depositions of the light-blocking material layer and the buffer material layer are omitted, the number of deposition processes is reduced, thereby reducing the manufacturing cost.

As described above, according to the present disclosure, the source electrode and the drain electrode to be formed as a lower portion of the thin film transistor in the display device. This simplifies the manufacturing process of the device, reduces the manufacturing time thereof, and reduces the manufacturing cost thereof.

Aspects of the present disclosure can be described as follows:

In a display device according to an embodiment of the present disclosure, a source electrode and a drain electrode spaced apart from each other are disposed on a top face of a substrate, and a light-blocking layer constituting the same layer together with and made of the same material as the source electrode and the drain electrode is disposed on a top face of the substrate. An interlayer insulating layer is disposed on a top face of the source electrode, the drain electrode and the light-blocking layer. A first contact-hole and a second contact-hole respectively corresponding to the source electrode and the drain electrode are formed in the interlayer insulating layer. A first connection line connects the source electrode and an active layer to each other via the first contact-hole, while a second connection line connects the drain electrode and the active layer to each other via the second contact-hole.

Further, a method for manufacturing a display device according to an embodiment of the present disclosure can be provided. In the method for manufacturing the display device, a source electrode and a drain electrode spaced from each other, and a light-blocking layer made of the same material as and constituting the same layer together with the source electrode and the drain electrode are formed on a top face of a substrate using a first mask process M1. An interlayer insulating layer is formed on a top face of the source electrode, the drain electrode and the light-blocking layer using a second mask process M2, wherein a first contact-hole and a second contact-hole respectively corresponding to the source electrode and the drain electrode are formed in the interlayer insulating layer. An active layer is formed on a top face of the interlayer insulating layer using a third mask process M3. An gate insulating layer and a gate electrode are sequentially formed on a top face of the active layer using a fourth mask process M4, wherein a first connection line connecting the source electrode and the active layer with each other via the first contact-hole, and a second connection line connecting the drain electrode and the active layer with each other via the second contact-hole are formed. A protective layer and a planarization layer are sequentially formed on a top face of the gate electrode using a fifth mask process M5, wherein a third contact-hole is formed in the planarization layer and the protective layer to correspond to the first connection line. A first electrode is formed on a top face of the planarization layer using a sixth mask process M6, wherein the first electrode is connected to the first connection line via the third contact-hole in the protective layer and planarization layer. Then, a light-emissive layer is formed on a top face of the first electrode, and a second electrode is formed on a top face of the light-emissive layer using a seventh mask process M7.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display device comprising:
   a first source electrode and a first drain electrode disposed on a substrate and spaced apart from each other;
   a light-blocking layer disposed on the substrate, wherein the light-blocking layer, the first source electrode and the first drain electrode are integrated into a single layer being coplanar, and the light-blocking layer extends directly from the first source electrode;
   an interlayer insulating layer disposed on the first source electrode, the first drain electrode and the light-blocking layer;
   a first active layer disposed on the interlayer insulating layer to expose a portion of the interlayer insulating layer;
   a gate insulating layer disposed on the first active layer;
   a first contact-hole and a second contact-hole passing through the interlayer insulating layer, the first active layer and the gate insulating layer, and respectively corresponding to the first source electrode and the first drain electrode;
   a first gate electrode disposed on the gate insulating layer;
   a first connection line connecting the first source electrode and the first active layer to each other via the first contact-hole; and
   a second connection line connecting the first drain electrode and the first active layer to each other via the second contact-hole,
   wherein one side of the first connection line and one side of the second connection line are disposed on a same layer as the gate insulating layer, an other side of the first connection line is disposed on the upper surface of the source electrode, and an other side of the second connection line is disposed on the upper surface of the drain electrode.

2. The display device of claim 1, wherein the first gate electrode, the first connection line and the second connection line constitute the same layer and are made of the same material.

3. The display device of claim 1, wherein the first gate electrode, the first connection line and the second connection line are disposed in the same layer using the same mask process.

4. The display device of claim 1, wherein a protective layer is disposed to cover the interlayer insulating layer, the first connection line, the first gate electrode and the second connection line, and
   wherein a planarization layer is disposed on the protective layer.

5. The display device of claim 4, wherein a third contact-hole is disposed in an area overlapping with the first source electrode of the protective layer and the planarization layer.

6. The display device of claim 5, wherein a first electrode is disposed on the planarization layer and is connected to the first connection line via the third contact-hole,
   wherein a light-emissive layer is disposed on the first electrode, and
   wherein a second electrode is disposed on the light-emissive layer.

7. The display device of claim 6, wherein a bank layer is disposed on the planarization layer so that the bank layer covers an outer region of the first electrode and exposes a center portion of the first electrode.

8. The display device of claim 7, wherein the second electrode is disposed on the light-emissive layer and a portion of a top face of the bank layer.

9. The display device of claim 1, wherein the first source electrode, the first drain electrode, the first active layer, the first connection line, the second connection line and the first gate electrode constitute a driving thin-film transistor.

10. The display device of claim 9, wherein a switching thin-film transistor connected to the driving thin-film transistor is disposed on the substrate.

11. The display device of claim 10, wherein the switching thin-film transistor includes a second source electrode and a second drain electrode disposed on the substrate, and a second active layer, and
    wherein the second source electrode and the second drain electrode are connected to the second active layer, respectively, via a third connection line and a fourth connection line passing through a fourth contact-hole and a fifth contact-hole, respectively.

* * * * *